United States Patent
Kang et al.

(10) Patent No.: US 11,757,076 B2
(45) Date of Patent: *Sep. 12, 2023

(54) LIGHT SOURCE MODULE AND DISPLAY PANEL USING THE SAME

(71) Applicant: SAMSUNG ELECTRONICS CO., LTD., Suwon-si (KR)

(72) Inventors: Chigoo Kang, Seoul (KR); Seogho Lim, Seongnam-si (KR); Ilseop Won, Hwaseong-si (KR); Jungwoo Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,009

(22) Filed: Nov. 14, 2022

(65) Prior Publication Data
US 2023/0073808 A1 Mar. 9, 2023

Related U.S. Application Data

(63) Continuation of application No. 17/060,215, filed on Oct. 1, 2020, now Pat. No. 11,502,229.

(30) Foreign Application Priority Data

Mar. 17, 2020 (KR) .......................... 10-2020-0032722

(51) Int. Cl.
*H01L 33/58* (2010.01)
*H01L 27/15* (2006.01)
(Continued)

(52) U.S. Cl.
CPC ................ *H01L 33/58* (2013.01); *F21V 5/04* (2013.01); *G02B 19/0014* (2013.01);
(Continued)

(58) Field of Classification Search
CPC ............. H01L 33/58; H01L 2933/0058; H01L 25/0753; H01L 27/14627; H01L 33/52;
(Continued)

(56) References Cited

U.S. PATENT DOCUMENTS 6,369,954 B1 * 4/2002 Berge ........................ G02B 3/14
349/200
6,372,608 B1 4/2002 Shimoda et al.
(Continued)

FOREIGN PATENT DOCUMENTS

KR 10-2011-0061067 A 6/2011

*Primary Examiner* — Feifei Yeung Lopez
(74) *Attorney, Agent, or Firm* — Lee IP Law, P.C.

(57) ABSTRACT

A light source module includes a circuit board, light emitting diode chips on an upper surface of the circuit board, the light emitting diode chips being spaced apart and each emitting blue light and having a first surface facing the upper surface of the circuit board, a second surface opposite the first surface, and first and second electrodes on the first surface, a first multilayer reflective structure on the second surface and including a plurality of alternately stacked insulating layers having different refractive indices, and a lens respectively covering each of the light emitting diode chips and contacting the upper surface of the circuit board at an acute contact angle, the lens having a thickness of 2.5 mm or less from the upper surface of the circuit board, and a contact region with the upper surface of the circuit board with a diameter of 1 mm to 3 mm.

20 Claims, 10 Drawing Sheets

(51) Int. Cl.

| | | |
|---|---|---|
| *H01L 33/62* | (2010.01) | |
| *H01L 33/48* | (2010.01) | |
| *H01L 33/60* | (2010.01) | |
| *H01L 33/38* | (2010.01) | |
| *H01L 33/10* | (2010.01) | |
| *G02F 1/13357* | (2006.01) | |
| *H01L 27/146* | (2006.01) | |
| *F21V 5/04* | (2006.01) | |
| *G02B 19/00* | (2006.01) | |

(52) U.S. Cl.
CPC ... *G02B 19/0066* (2013.01); *G02F 1/133606* (2013.01); *H01L 27/14627* (2013.01); *H01L 27/156* (2013.01); *H01L 33/10* (2013.01); *H01L 33/387* (2013.01); *H01L 33/486* (2013.01); *H01L 33/60* (2013.01); *H01L 33/62* (2013.01); *H01L 2933/0058* (2013.01)

(58) Field of Classification Search
CPC ....... H01L 33/54; H01L 27/156; H01L 33/10; F21V 5/04; G02B 19/0066; G02B 19/0014
See application file for complete search history.

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,626,210 B2 | 12/2009 | Shchekin et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,090,441 B2 | 10/2018 | Yamada et al. | |
| 10,147,853 B2 | 12/2018 | Keller et al. | |
| 10,355,181 B2 | 7/2019 | Yamada | |
| 11,037,912 B1 | 6/2021 | Meitl et al. | |
| 11,502,229 B2 * | 11/2022 | Kang | H01L 33/486 |
| 2006/0157726 A1 | 7/2006 | Loh et al. | |
| 2007/0153365 A1 * | 7/2007 | Dai | H01S 5/041 |
| | | | 359/344 |
| 2008/0012032 A1 | 1/2008 | Bhandarkar et al. | |
| 2011/0292302 A1 | 12/2011 | Park et al. | |
| 2013/0038644 A1 | 2/2013 | Chan et al. | |
| 2014/0353705 A1 | 12/2014 | Kamikawa et al. | |
| 2015/0155439 A1 * | 6/2015 | Cich | H01L 33/16 |
| | | | 362/296.09 |
| 2016/0290587 A1 | 10/2016 | Nakagawa et al. | |
| 2016/0293811 A1 * | 10/2016 | Hussell | H01L 27/156 |
| 2017/0069611 A1 | 3/2017 | Zhang et al. | |
| 2017/0345974 A1 | 11/2017 | Yamada et al. | |
| 2018/0023784 A1 | 1/2018 | Tamura et al. | |
| 2018/0182940 A1 | 6/2018 | Yamamoto et al. | |
| 2018/0356684 A1 | 12/2018 | Chang et al. | |
| 2019/0229097 A1 * | 7/2019 | Takeya | H01L 25/167 |
| 2020/0227395 A1 * | 7/2020 | Shi | H01L 25/0753 |
| 2021/0119087 A1 | 4/2021 | Kim | |

* cited by examiner

'B'

II

LIGHT SOURCE MODULE AND DISPLAY PANEL USING THE SAME

CROSS-REFERENCE TO RELATED APPLICATION(S)

This is a continuation of U.S. patent application Ser. No. 17/060,215 filed Oct. 1, 2020, which is incorporated by reference herein in its entirety.

Korean Patent Application No. 10-2020-0032722, filed on Mar. 17, 2020, in the Korean Intellectual Property Office, and entitled: "Light Source Module and Display Panel Using the Same," is incorporated by reference herein in its entirety.

BACKGROUND

1. Field

Embodiments relate to a light source module and a display panel using the same.

2. Description of the Related Art

Semiconductor light emitting devices emit light using a principle of recombination of electrons and holes when a current is applied thereto, and are widely used as light sources due to various advantages thereof, e.g., low power consumption, high brightness, miniaturization, and the like. In particular, after nitride-based light emitting devices were developed, a utilization range thereof was further expanded, e.g., to be implemented as a light source module, a household lighting apparatus, automobile lighting, or the like.

SUMMARY

According to an aspect of embodiments, a light source module is provided. The light source module may include a glass substrate, a plurality of light emitting diode chips on an upper surface of the glass substrate, the plurality of light emitting diode chips being spaced apart from each other by a distance of 7.5 mm or less, and each of the plurality of light emitting diode chips including a first surface facing the upper surface of the glass substrate, a second surface opposite the first surface, first and second electrodes on the upper surface of the glass substrate and connected to the first surface, wherein edges of each of the plurality of light emitting diode chips have a size of 500 μm or less, a multilayer reflective structure on the second surface of each of the plurality of light emitting diode chips, the multilayer reflective structure covering the respective second surface, and the multilayer reflective structure including a plurality of alternately stacked insulating layers having different refractive indices, and a lens respectively covering each of the plurality of light emitting diode chips and contacting the glass substrate, the lens having an acute contact angle with the upper surface of the glass substrate and including a silicone material having a viscosity of 30,000 cPs to 100,000 cPs, and the lens having a height to width ratio of 0.2 to 0.4, the width being a diameter of a contact region between the upper surface of the glass substrate and the lens.

According to an aspect of embodiments, a light source module is provided. The light source module may include a circuit board, a plurality of light emitting diode chips on an upper surface of the circuit board, the plurality of light emitting diode chips being spaced apart from each other, and each of the plurality of light emitting diode chips having a first surface facing the upper surface of the circuit board, a second surface opposite the first surface, and first and second electrodes on the first surface, wherein the plurality of light emitting diode chips emits blue light, a first multilayer reflective structure on the second surface of each of the plurality of light emitting diode chips, the first multilayer reflective structure covering the respective second surface, and the first multilayer reflective structure including a plurality of alternately stacked insulating layers having different refractive indices, and a lens respectively covering each of the plurality of light emitting diode chips and contacting the upper surface of the circuit board at an acute contact angle, the lens having a thickness of 2.5 mm or less from the upper surface of the circuit board, and a contact region with the upper surface of the circuit board with a diameter of 1 mm to 3 mm.

According to an aspect of embodiments, a display panel is provided. The display panel may include a circuit board, a plurality of light emitting diode chips on an upper surface of the circuit board, the plurality of light emitting diode chips being spaced apart from each other, and each of the plurality of light emitting diode chips having a first surface facing the upper surface of the circuit board, a second surface opposite the first surface, and first and second electrodes on the first surface, wherein the plurality of light emitting diode chips emits blue light, a multilayer reflective structure on the second surface of each of the plurality of light emitting diode chips, the multilayer reflective structure covering the respective second surface, and the multilayer reflective structure including a plurality of alternately stacked insulating layers having different refractive indices, a lens respectively covering each of the plurality of light emitting diode chips and contacting the upper surface of the circuit board at an acute contact angle, the lens having a height to width ratio of 0.2 to 0.4, the width being a diameter of a contact region between the upper surface of the circuit board and the lens, and an optical sheet in front of the plurality of light emitting diode chips and including a quantum dot converting the blue light into white light.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
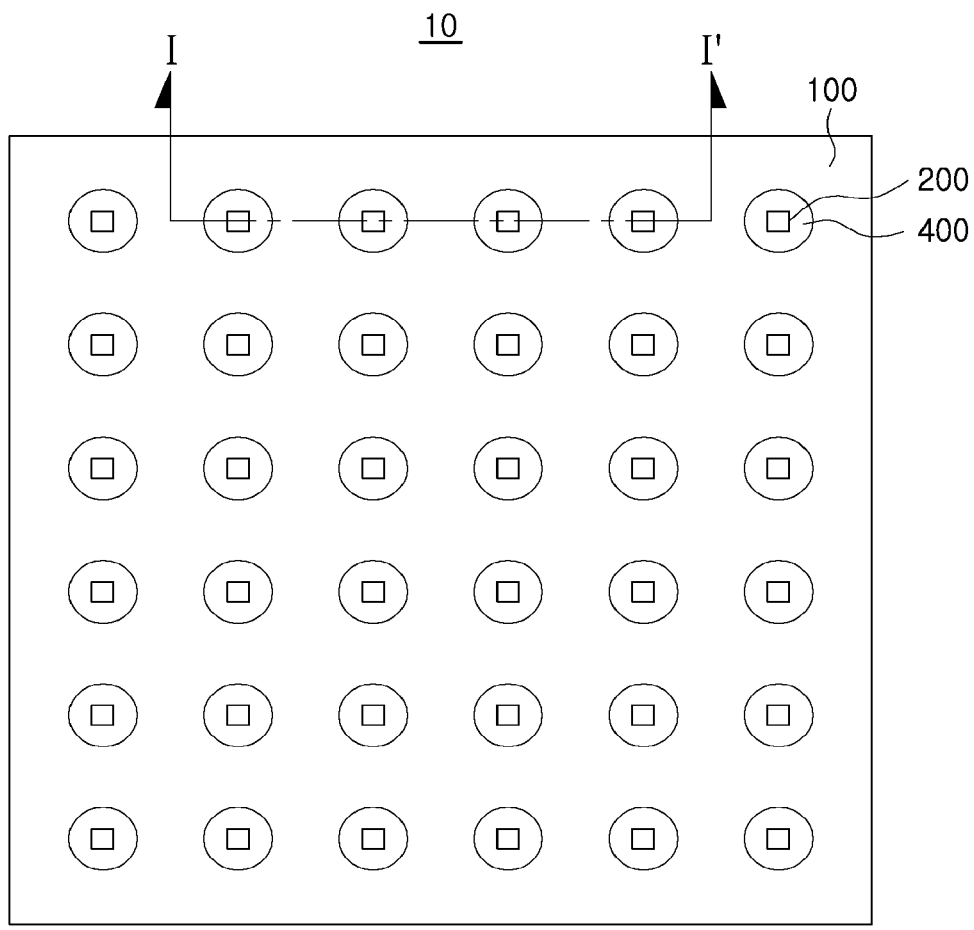
FIG. 1 is a plan view of a light source module according to an example embodiment.
Figure 2:
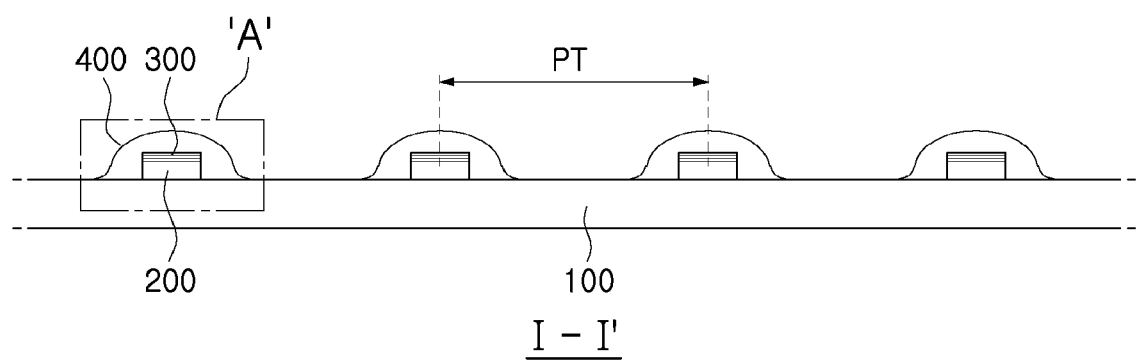
FIG. 2 is a cross-sectional view taken along line I-I' of FIG. 1.
Figure 3:
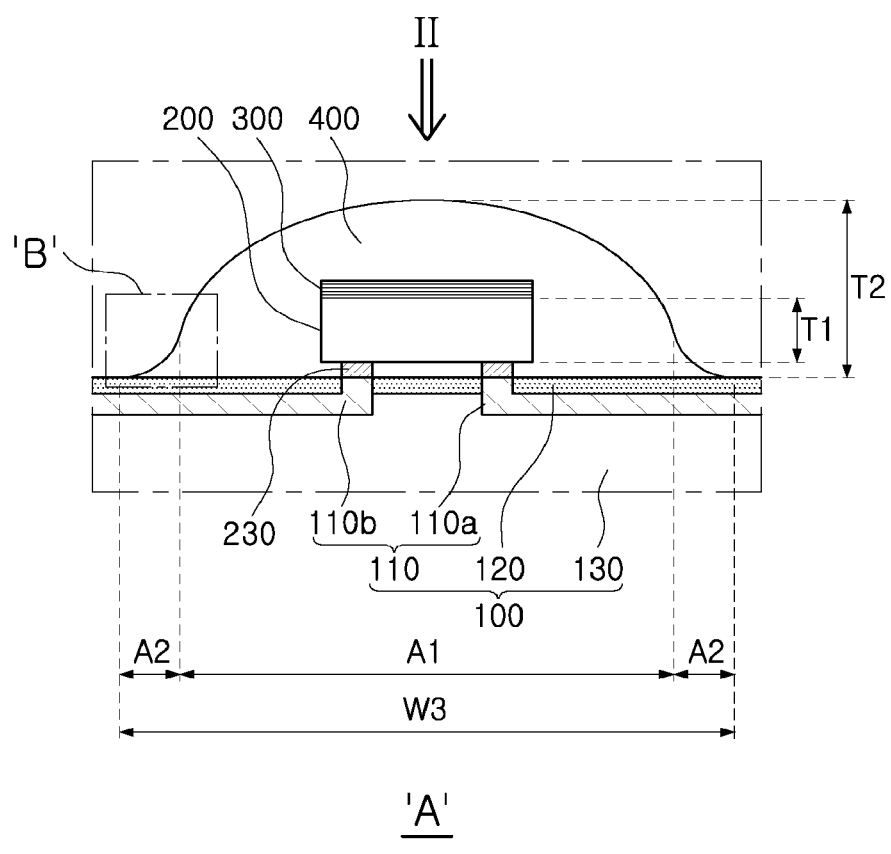
FIG. 3 is an enlarged view of portion 'A' in FIG. 2.

FIG. 1 is a plan view of a light source module according to an example embodiment, FIG. 2 is a cross-sectional view along line I-I' of FIG. 1, and FIG. 3 is an enlarged view of portion 'A' in FIG. 2.

Referring to FIGS. 1 and 2, in a light source module 10 according to an example embodiment, a plurality of light emitting diode chips 200 may be arranged on a circuit board 100 at a predetermined pitch PT. In an example embodiment, the pitch PT may be, e.g., 30 mm or less, e.g., 7.5 mm or less. A multilayer reflective structure 300 may be disposed on, e.g., a top surface of, each of the light emitting diode chips 200, and a lens 400 may be disposed to cover the light emitting diode chip 200 and the multilayer reflective structure 300. In an example embodiment, the plurality of light emitting diode chips 200 are shown as being arranged in a matrix form on the circuit board 100, but is not limited thereto, and may be arranged in various structures, e.g., a hexagonal arrangement.

The circuit board 100 may be, e.g., a glass substrate. The glass substrate may be a printed circuit board having an electrode pattern formed on a base portion e.g., the base portion may be made of glass, hard glass, quartz glass, or the like. Such a glass substrate has a high heat dissipation effect and a relatively low coefficient of thermal expansion (CTE), e.g., as compared to a printed circuit board using FR-4 formed by impregnating glass fibers with a resin. Therefore, it is possible to realize a more refined electrode pattern, e.g., as compared to a conventional printed circuit board using FR-4.

Figure 6:
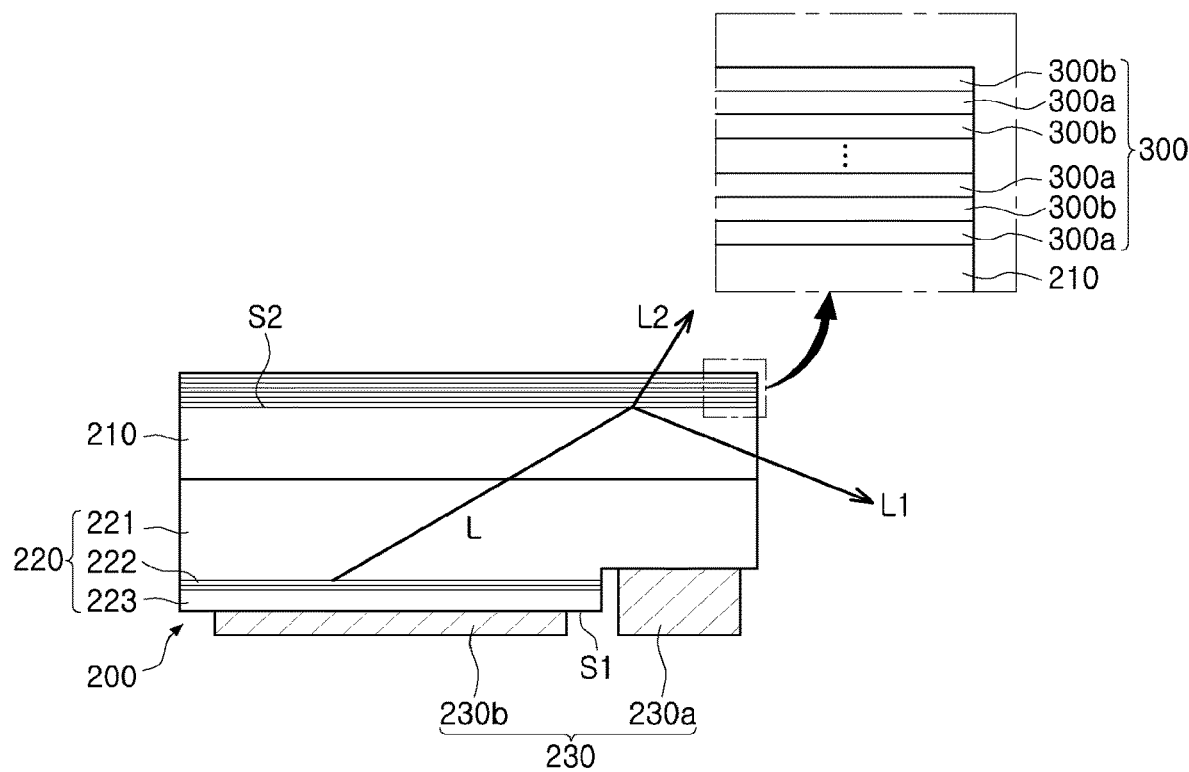
FIG. 6 is an enlarged view of the light emitting diode chip and the multilayer reflective structure of FIG. 3.

In detail, referring to FIGS. 3 and 6, the circuit board 100 may include a base portion 130 and first and second electrode patterns 110a and 110b formed, e.g., embedded, in, e.g., on an upper surface of, the base portion 130. For example, as illustrated in FIG. 3, each of the first and second electrode patterns 110a and 110b may have a horizontal portion on the base portion 130 and a vertical portion extending upwardly from an edge of the horizontal portion.

A coating layer 120 may be formed on the upper surface of the circuit board 100, e.g., on an upper surface of the base portion 130 with the first and second electrode patterns 110a and 110b, to cover an entirety of the circuit board 100, e.g., the vertical portions of the first and second electrode patterns 110a and 110b may extend upwardly through the coating layer 120 (FIG. 3). That is, some regions of the first and second electrode patterns 110a and 110b, e.g., the vertical portions, may penetrate the coating layer 120 and be exposed on the upper surface of the circuit board 100, and may be electrically connected by a conductive adhesive layer, e.g., a plurality of light emitting diode chips 200, solder bumps, and the like. The coating layer 120 may be formed by applying photo solder resist (PSR) ink. For example, the coating layer 120 may define the upper surface of the circuit board 100.

The plurality of light emitting diode chips 200 may be mounted on the upper surface of the circuit board 100, respectively. As illustrated in FIG. 6, each of the plurality of light emitting diode chips 200 may have a growth substrate 210, a light emitting structure 220, and first and second electrodes 230a and 230b.

In detail, as illustrated in FIG. 3, each of the plurality of light emitting diode chips 200 may have a thickness T1, e.g., about 100 μm or less. In addition, referring to FIG. 5, when viewed from above, each of the plurality of light emitting diode chips 200 may have a square shape or a rectangular shape, and edges W1 and W2 forming each side of the square or rectangle have a size of, e.g., about 500 μm or less. For example, the light emitting diode chips 200 may have various sizes, e.g., areas as viewed in a top view, such as 500 μm×500 μm, 200 μm×300 μm, and 175 μm×300 μm.

Referring to FIG. 6, each of the light emitting diode chips 200 may have a first surface S1 and a second surface S2 opposing the first surface S1. The first surface S1 may be provided, e.g., defined, by a second conductivity-type semiconductor layer 223 of the light emitting structure 220, and the second surface S2 may be provided, e.g., defined, by the growth substrate 210 described below. An electrode 230, e.g., the first and second electrodes 230a and 230b, may be disposed on the first surface S1, and the multilayer reflective structure 300 may be stacked on the second surface S2, e.g., so the growth substrate 210 may be between the multilayer reflective structure 300 and the light emitting structure 220.

The growth substrate 210 may be formed of insulating, conductive, or semiconductor materials, e.g., sapphire, Si, SiC, MgAl$_2$O$_4$, MgO, LiAlO$_2$, LiGaO$_2$, GaN, AlN, metal substrates, and the like. Sapphire, widely used as a growth substrate for a nitride semiconductor, is a crystal having electrical insulation and hexagonal-Rhombo R3c symmetry, and its lattice constants in c-axis and a-axis directions are 13.001 Å and 4.758 Å, respectively. Sapphire has a C (0001) plane, A (11-20) plane, R (1-102) plane, and the like. In this case, the C plane is mainly used as a growth substrate for nitrides because it is relatively easy to grow a nitride thin film that is stable at high-temperatures.

The light emitting structure 220 may include a first conductivity-type semiconductor layer 221, an active layer 222, and the second conductivity-type semiconductor layer 223, sequentially disposed on the growth substrate 210. The first and second conductivity-type semiconductor layers 221 and 223 may be n-type and p-type semiconductor layers, respectively, and may be formed of a nitride semiconductor. Accordingly, although not limited thereto, in an example embodiment, the first and second conductivity-type semiconductor layers 221 and 223 may be understood to mean n-type and p-type semiconductor layers, respectively. The first and second conductivity-type semiconductor layers 221 and 223 may have an Al$_x$In$_y$Ga$_{(1-x-y)}$N composition formula (where, 0≤x<1, 0≤y<1, and 0≤x+y<1), e.g., GaN, AlGaN, InGaN.

The active layer 222 may be a layer for emitting visible light (a wavelength range of about 350 nm to about 680 nm), and may be composed of an undoped nitride semiconductor layer having a single or multiple quantum well structure. In an example embodiment, the active layer 222 may emit blue light. The active layer 222 may be formed of, e.g., a multi quantum well structure in which a quantum barrier layer and a quantum well layer of Al$_x$In$_y$Ga$_{(1-x-y)}$N (0≤x<1, 0≤y<1, 0≤x+y<1) are alternately stacked, to use a structure having a predetermined band gap. Electrons and holes are recombined and emit light by the quantum well structure. In the case of a multi-quantum well structure, e.g., an InGaN/GaN structure, can be used. The first and second conductivity-type semiconductor layers 221 and 223 and the active layer 222 may be formed by using a crystal growth process, e.g., metalorganic chemical vapor deposition (MOCVD), molecular beam epitaxy (MBE), or hydrated vapor phase epitaxy (HVPE).

In the light emitting diode chip 200, a light diode chip having a flip-chip structure, i.e., a structure in which the electrode 230 is disposed only on one surface, may be used. In an example embodiment, the electrode 230 may include first and second electrodes 230a and 230b, and the first and second electrodes 230a and 230b may be disposed on the first surface S1 of the light emitting diode chip 200.

The first and second electrodes 230a and 230b may be for applying external power to the first and second conductivity-type semiconductor layers 221 and 223, and may be provided to form an ohmic connection, respectively. In the first and second electrodes 230a and 230b, a conductive material having a characteristic of ohmic connection with the first and second conductivity-type semiconductor layers 221 and 223 may be formed of a single layer or a multi-layer structure. For example, the first and second electrodes 230a and 230b may be formed of, e.g., one or more of Au, Ag, Cu, Zn, Al, In, Ti, Si, Ge, Sn, Mg, Ta, Cr, W, Ru, Rh, Ir, Ni, Pd, Pt, a transparent conductive oxide (TCO), and the like.

For example, as further illustrated in FIG. 6, the multilayer reflective structure 300 may be disposed on the second surface S2 of the light emitting diode chip 200. The multilayer reflective structure 300 may be disposed to entirely cover the light emitting structure 220.

The multilayer reflective structure 300 may reflect a first light L1 toward an upper direction in which the growth substrate 210 is disposed among the light L emitted from the active layer 222, to redirect the first light L1 toward a side surface direction of the light emitting diode chip 200. That is, as illustrated in FIG. 6, the light L emitted from the active layer 222 toward the multilayer reflective structure 300 may be transmitted through the growth substrate 210 to be incident on the multilayer reflective structure 300, such that the first light L1 may be reflected from the multilayer reflective structure 300 to be redirected back through the growth substrate 210 toward the side, e.g., lateral, surface of the light emitting diode chip 200. Therefore, an amount of light emitted to the side surface of the light emitting diode chip 200 may increase and the orientation angle may entirely increase.

In addition, the multilayer reflective structure 300 may transmit the second light L2 of the light L upwardly, i.e., through the multilayer reflective structure 300, and thus may emit the second light L2 in front of the light emitting diode chip 200. Therefore, it is possible to prevent the occurrence of dark spots in which the front of the light emitting diode chip 200 is relatively dark.

The multilayer reflective structure 300 may be provided in a structure in which layers having different refractive indices are alternately stacked in a vertical direction. That is, the multilayer reflective structure 300 may be disposed in a structure in which a first insulating layer 300a and a second insulating layer 300b having different indices are alternately stacked. The multilayer reflective structure 300 may be provided to a Distributed Bragg Reflector (DBR) by appropriately controlling refractive indices and thicknesses of the first insulating layer 300a and the second insulating layer 300b. For example, when a wavelength of the light L generated in the active layer 222 is $\lambda$ and n is a refractive index of the corresponding layer, the first insulating layer 300a and the second insulating layer 300b of the multilayer reflective structure 300 may be formed to have a thickness of $\lambda/4n$, and may have a thickness of approximately 300 Å to 900 Å. In this case, in the multilayer reflective structure 300, the refractive index and thickness of each of the first insulating layer 300a and the second insulating layer 300b may be selected and designed to have a high reflective ratio (90% or more) for the wavelength of the light L generated in the active layer 222. The first insulating layer 300a and the second insulating layer 300b may be formed to have the same thickness, but may have different thicknesses The first insulating layer 300a and the second insulating layer 300b, constituting the multilayer reflective structure 300, may be made of a material having insulating properties and light transmissive characteristics. For example, the multilayer reflective structure 300 may include a silicon oxide or a silicon nitride, e.g., may be made of $SiO_2$, SiN, $SiO_xN_y$, $TiO_2$, $Si_3N_4$, $Al_2O_3$, TiN, AlN, $ZrO_2$, TiAlN, TiSiN, or the like. In an example embodiment, the first insulating layer 300a may be made of $SiO_2$, and the second insulating layer 300b may be made of $TiO_2$.

When the first insulating layer 300a and the second insulating layer 300b are stacked once, respectively, which is defined as one pair of insulating layers, the multilayer reflective structure 300 may have a structure in which one pair of insulating layers is repeatedly stacked 5 to 30 times in a vertical direction. When the multilayer reflective structure 300 includes a pair of insulating stacked less than five times, reflectivity may be low, thereby reducing operability as a distributed Bragg reflector. On the other hand, when the multilayer reflective structure 300 includes a pair of insulating layers stacked more than thirty times, the amount of the second light L2 penetrating the multilayer reflective structure 300 may rapidly decrease, thereby causing dark spots.

Figure 7:
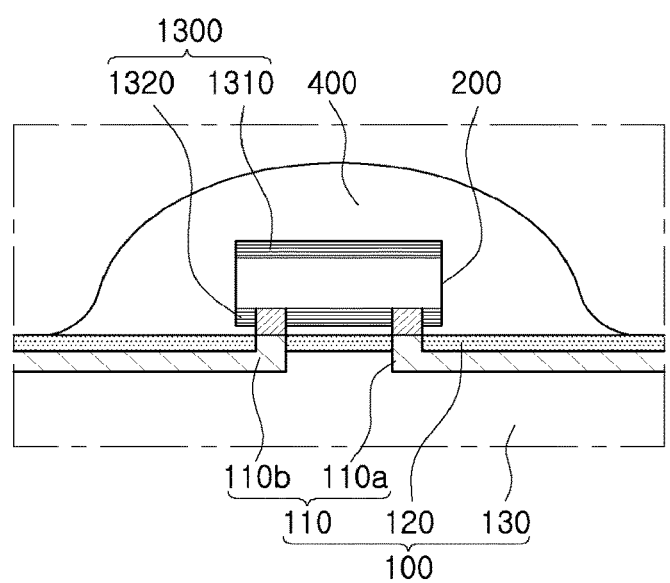
FIG. 7 shows a modified example of FIG. 2.

In another example, as illustrated in FIG. 7, a multilayer reflective structure 1300 may be disposed on an upper surface and a lower surface of the light emitting diode chip 200, respectively. That is, a first multilayer reflective structure 1310 may be disposed on the upper surface of the light emitting diode chip 200, and a second multilayer reflective structure 1320 may be disposed on the lower surface of thereof. The first and second multilayer reflective structures 1310 and 1320 may be have substantially the same structures as the multilayer reflective structure 300 described with reference to FIGS. 3 and 6.

Figure 4:
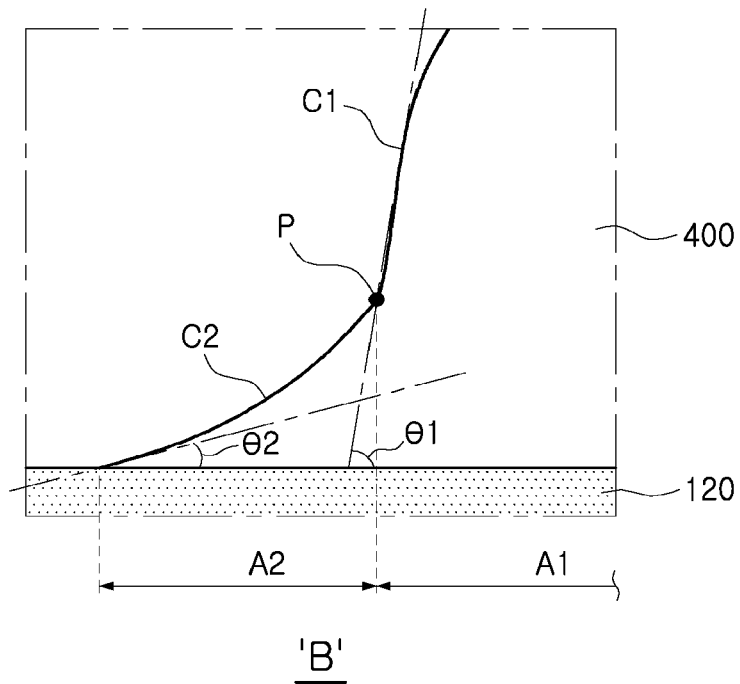
FIG. 4 is an enlarged view of portion 'B' in FIG. 3.
Figure 5:
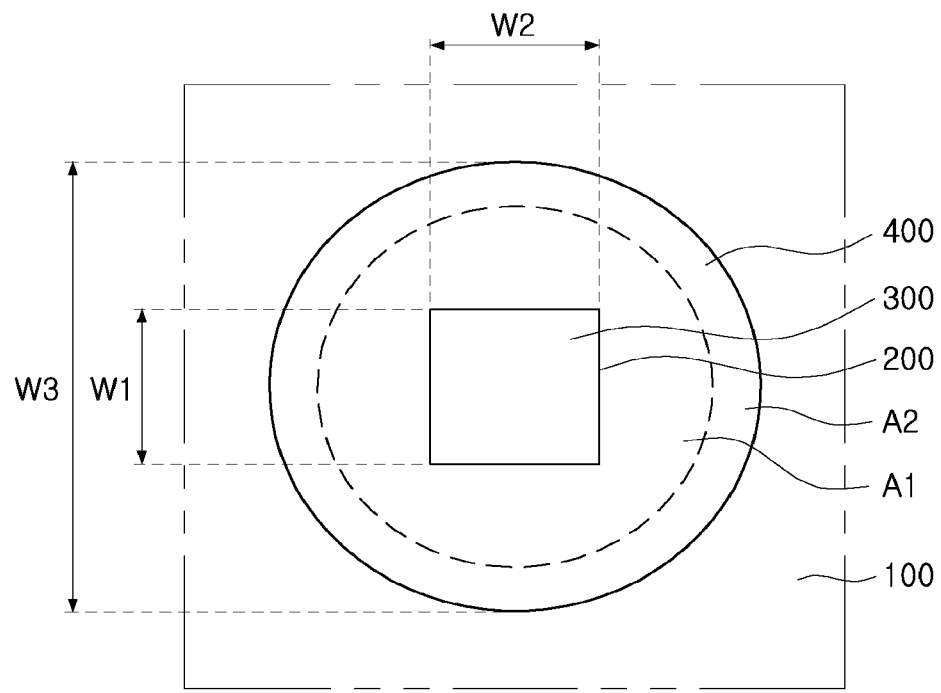
FIG. 5 is a plan view viewed from direction II of FIG. 3.

Referring to FIGS. 3 to 5, the lens 400 will be described.

The lens 400 may be provided in a number corresponding to each of the plurality of light emitting diode chips 200 mounted on the circuit board 100, e.g., the number of lenses 400 may equal the number of the light emitting diode chips 200 in a one-to-one relationship. The lens 400 may be disposed to cover the light emitting diode chip 200 and the multilayer reflective structure 300. The lens 400 may encapsulate the light emitting diode chip 200 and the multilayer reflective structure 300 to protect them from moisture and heat, and adjust a surface shape to increase an orientation angle of light emitted from the light emitting diode chip 200. For example, as illustrated in FIG. 3, the lens 400 may have a dome shape surrounding and enclosing the light emitting diode chip 200 with the multilayer reflective structure 300, e.g., the lens 400 may completely cover the top surface of the multilayer reflective structure 300 and lateral surfaces of the light emitting diode chip 200 and of the multilayer reflective structure 300, to spread the light from the light emitting diode chip 200 over a larger area, e.g., in a backlight unit of a display.

The lens 400 may be formed of a light-transmissive material. The lens 400 may be formed through a dispensing process or a droplet process directly in which an insulating resin having light transmissivity, e.g., silicone, modified silicone, epoxy, urethane, oxetane, acrylic, polycarbonate, polyimide, and combinations thereof, is directly formed on the circuit board 100 on which the light emitting diode chip 200 is mounted.

Referring to FIG. 3, the lens 400 may have an aspect ratio of about 0.2 to about 0.4. The aspect ratio is a ratio of a diameter W3, i.e., a diameter of a region in which the circuit board 100 and the lens 400 contact each other, and a thickness T2 of the lens 400. For example, as illustrated in FIG. 3, the diameter W3 may be larger than the thickness T2, e.g., so the aspect ratio is T2/W3. For example, the lens 400 may have the diameter W3 of about 1 mm to about 3 mm and the thickness T2 of about 2.5 mm or less. Therefore, a display panel with the light source module 10 employing the lens 400 of an example embodiment may have a very thin thickness.

Referring to FIGS. 3 and 4, the lens 400 may have a first region A1 disposed in a central region and a second region A2 disposed at a periphery of the first region A1, e.g., the second region A2 may surround an entire perimeter of the first region A1 in a top view. In detail, as illustrated in FIG. 3, the first region A1 is a region having a convex surface shaped upwardly relative to the circuit board 100, e.g., water droplet-shaped bulging upwardly relative to the coating layer 120, and may increase directivity of light emitted from the light emitting diode chip 200 due to a high aspect ratio. For example, an upper surface of the first region A1 may be curved above, e.g., to completely overlap, the upper surface of the multilayer reflective structure 300, and radially extend beyond lateral surface of the light emitting diode chip 200 and the multilayer reflective structure 300.

The second region A2 is a region which extends radially from the first region A1 toward the circuit board 100. As illustrated in FIG. 3, the second region A2 gradually becomes thinner toward an outside, e.g., a vertical distance between the circuit board 100 and an outer surface of the lens 400 in the second region A2 may decrease as a distance from a terminal edge of the lens 400 decreases, so the outer surface of the lens 400 in the second region A2 may have a concave surface shape relative to the circuit board 100. The second region A2 may be naturally formed at a periphery of the first region A1 through a dispensing process or a droplet process forming the lens 400.

Referring to FIG. 4, the surface shapes of the first region A1 and the second region A2 may be formed to have a first curved surface C1 and a second curved surface C2, respectively. An inflection point P may be formed at a point at which the first curved surface C1 and the second curved surface C2 contact. The second curved surface C2 may have a contact angle θ2 of an acute angle with respect to the upper surface of the circuit board 100, e.g., the contact angle θ2 may be inside the lens 400 between the upper surface of the coating layer 120 and a tangent line to the second curved surface C2. The first curved surface C1 may have a first angle θ1 larger than the contact angle θ2, e.g., the first angle θ1 may be inside the lens 400 between the upper surface of the coating layer 120 and a tangent line to the first curved surface C1.

The surface shape of the lens 400 may be adjusted according to viscosity of a liquid silicone material for forming the lens 400, in a process of forming the lens 400. In an example embodiment, the liquid silicone constituting the lens 400 may have a viscosity of about 30,000 cPs to about 100,000 cPs. The liquid silicone having a viscosity of about 30,000 cPs to about 100,000 cPs, may be cured while having a unique surface shape, when doped in a form of droplets. As will be described in more detail below with reference to FIG. 15, in the droplet D1 of the silicone material formed through the dispensing process or the droplet process, a force F2 to spread and a force F1 to agglomerate act simultaneously to determine a surface shape of the lens 400. The first region A1 has the greater force F1 to agglomerate than the force F2 to spread, such that the first region A1 forms a droplet shape that is convex upwardly and has a high aspect ratio. On the other hand, the second region A2 may be formed into a shape having a low contact angle θ2 because the force F2 to spread is greater than the force F1 to be agglomerated, and spreads it on the surface of the circuit board 100. Therefore, the second region A2 may have a shape that gradually spreads thinner toward the outside.

Various example embodiments of a light source module will be described with reference to FIGS. 8 to 12.

Figure 8:
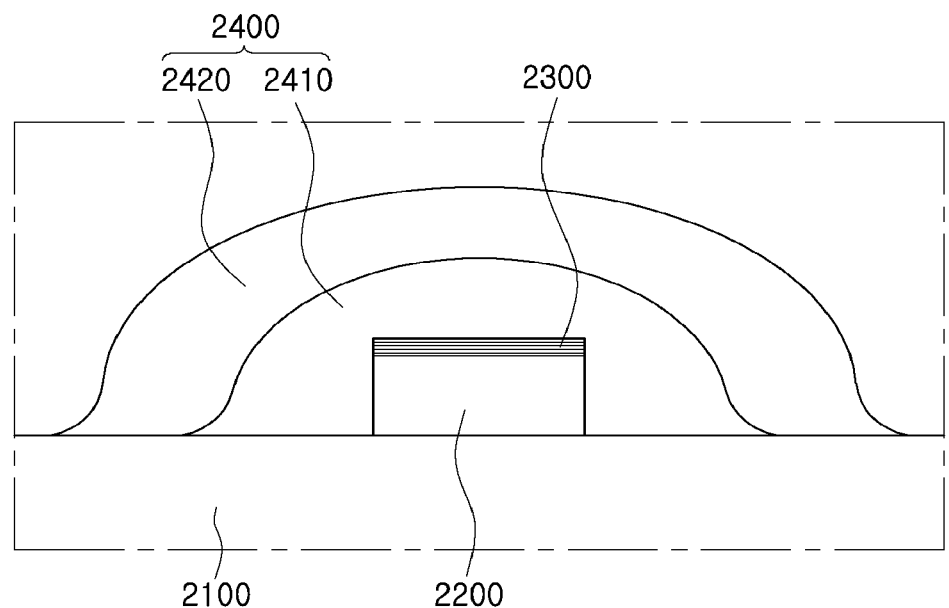
FIGS. 8, 9, 10, and 12 show various example embodiments of a light source module.
Figure 9:
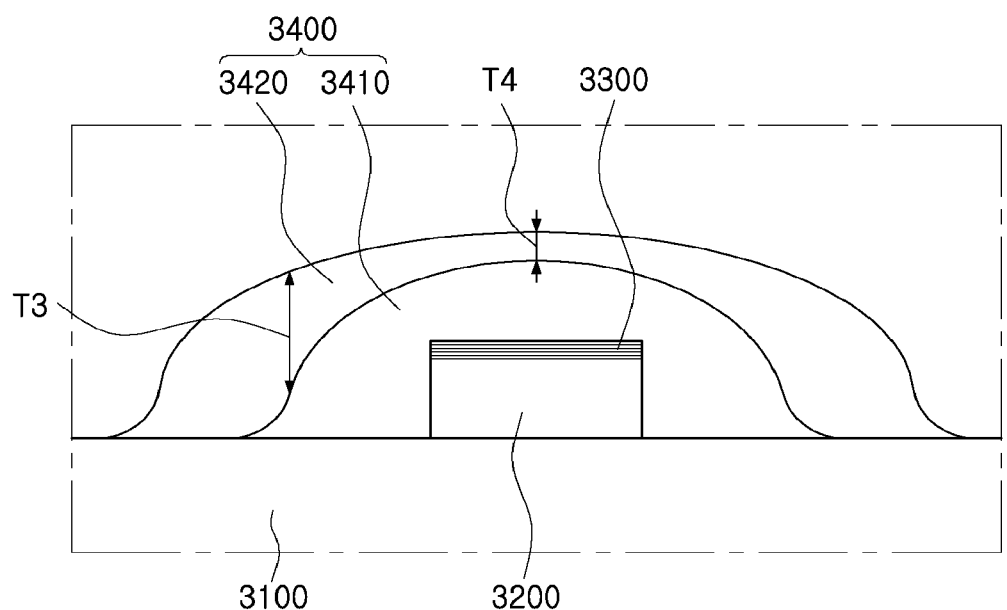
Figure 10:
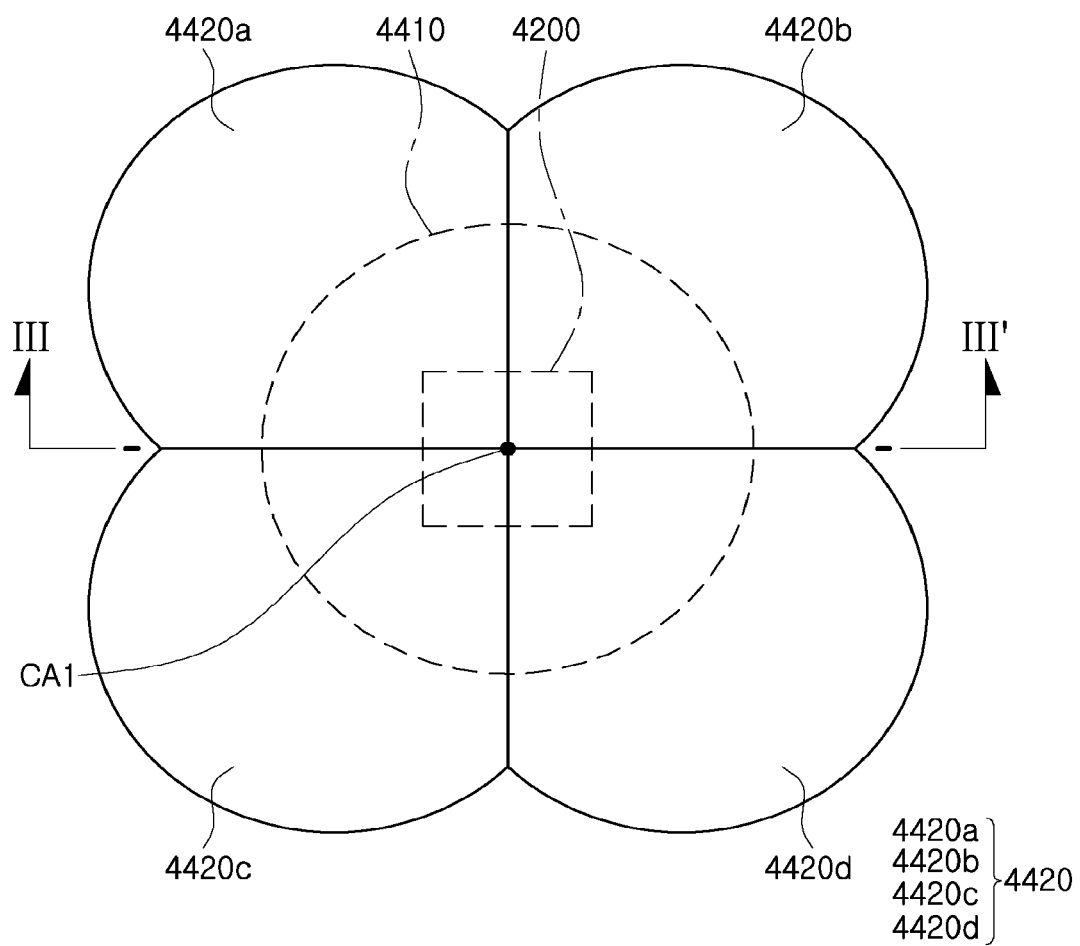
Figure 11:
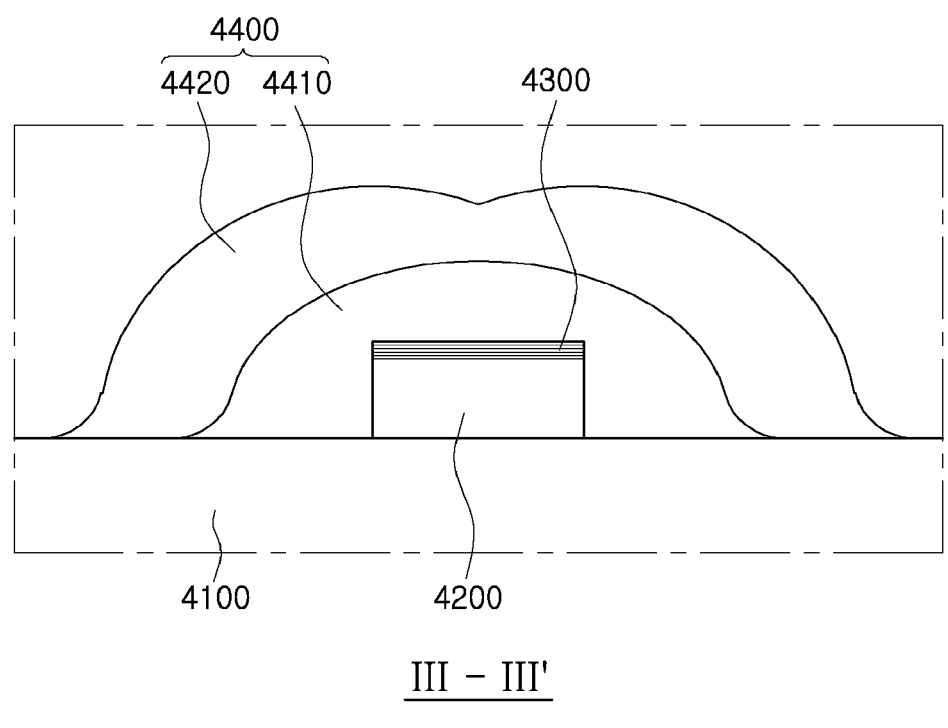
FIG. 11 is a cross-sectional view taken along line III-III' of FIG. 10.

FIGS. 8, 9, 10, and 12 show various example embodiments of a light source module, and FIG. 11 is a cross-sectional view taken along line III-III' of FIG. 10.

Referring to FIG. 8, according to an example embodiment, a lens 2400 may be formed of a plurality of layers on a substrate 2100. The configuration of the substrate 2100, a light emitting diode chip 2200, and a multilayer reflective structure 2300, except for the lens 2400, is the same as that of the circuit board 100, the light emitting diode chip 200, and the multilayer reflective structure 300, respectively, described previously with reference to FIGS. 2-6, and thus, descriptions thereof will be omitted.

As illustrated in FIG. 8, the lens 2400 may include a first lens 2410 and a second lens 2420 that are stacked, e.g., the first lens 2410 may be between the multilayer reflective structure 300 and the second lens 2420. The second lens 2420 may be disposed to cover all surfaces of the first lens 2410. That is, the first lens 2410 may be disposed to cover the light emitting diode chip 2200, respectively, and be in contact with an upper surface of the substrate 2100, and the second lens 2420 may be disposed to cover the first lens 2410 and be in contact with the upper surface of the substrate 2100. The first lens 2410 and the second lens 2420 may be made of a silicone material having first and second viscosities, respectively, which are different from each other. In this case, the first viscosity may be greater than the second viscosity. In addition, the first lens 2410 and the second lens 2420 may be made of a silicone material having different first and second refractive indices. In this case, the first refractive index may be smaller than the second refractive index. Therefore, the first lens 2410 and the second lens 2420 may have different optical characteristics.

Referring to FIG. 9, according to an example embodiment, a lens 3400 may be substantially the same as the lens 2400 described previously with reference to FIG. 8, with the exception that the plurality of layers of the lens 3400 have different profile shapes. The configuration of a substrate 3100, a light emitting diode chip 3200, a multilayer reflective structure 3300, and a first lens 3410 is the same as that of the substrate 2100, the light emitting diode chip 2200, the multilayer reflective structure 2300, and the first lens 2410, respectively, described previously with reference to FIG. 8, and thus, descriptions thereof will be omitted.

As illustrated in FIG. 9, the lens 3400 may include the first lens 3410 and a second lens 3420 stacked on the substrate 3100. The second lens 3420 may have a different outer profile shape than the first lens 3410. That is, a thickness T4 in a central region of the second lens 3420 is thinner than a thickness T3 in an edge region of the second lens 3420, e.g., the thicknesses T3 and T4 may be measured along a normal direction to an upper surface of the substrate 3100. Accordingly, the lens 3400 may have optical characteristics that are different from those of lens 2400 of FIG. 8.

Referring to FIGS. 10 and 11, according to an example embodiment, a lens 4400 may be substantially the same as the lens 2400 described previously with reference to FIG. 8, with the exception that the plurality of layers of the lens 4400 have different profile shapes. The configuration of a substrate 4100, a light emitting diode chip 4200, a multilayer reflective structure 4300, and a first lens 4410 is the same as that of the substrate 2100, the light emitting diode chip 2200, the multilayer reflective structure 2300, and the first lens 2410, respectively, described previously with reference to FIG. 8, and thus, descriptions thereof will be omitted.

As illustrated in FIG. 11, the lens 4400 may include the first lens 4410 and a second lens 4420 stacked on the substrate 4100. The second lens 4420 may have a different outer profile shape than the first lens 4410. That is, when viewed from above (FIG. 10), the second lens 4420 shows a case of being rotationally symmetrical at predetermined angle with respect to a central axis CA1 of the first lens 4410. In an example embodiment, the second lens 4420 may have a shape that is rotationally symmetrical every 90 degrees. Therefore, the second lens 4420 may have four convex regions 4420a to 4420d. In an example embodiment, the second lens 4420 may have four convex regions 4420a to 4420d, but is not limited thereto, and may have eight convex regions.

Figure 12:
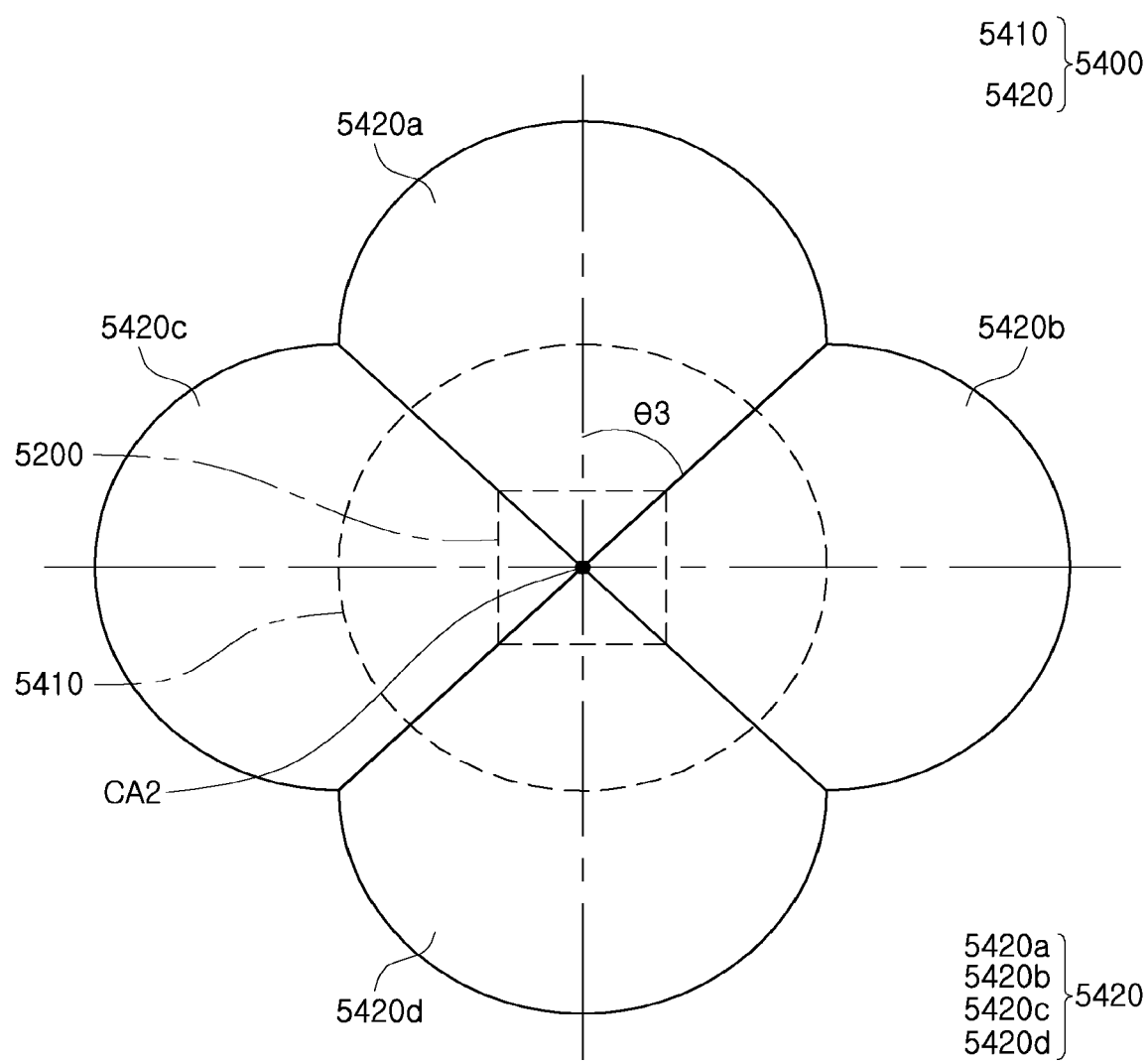

Referring to FIG. 12, according to an example embodiment, a lens 5400 may be substantially the same as the lens 4400 described previously with reference to FIGS. 10-11, with the exception that a second layer has a different rotational symmetry. The configuration of a light emitting diode chip 5200 and a first lens 5410 is the same as that of the light emitting diode chip 4200 and the first lens 4410, respectively, described previously with reference to FIGS. 10-11, and thus, descriptions thereof will be omitted.

As illustrated in FIG. 12, the lens 5400 may include the first lens 5410 and a second lens 5420. While the second lens 5420 has a shape that is rotationally symmetrical every 90 degrees, the second lens 5420 includes four convex regions 5420a to 5420d that are rotated by θ3 based on a central axis CA2.

Figure 13:
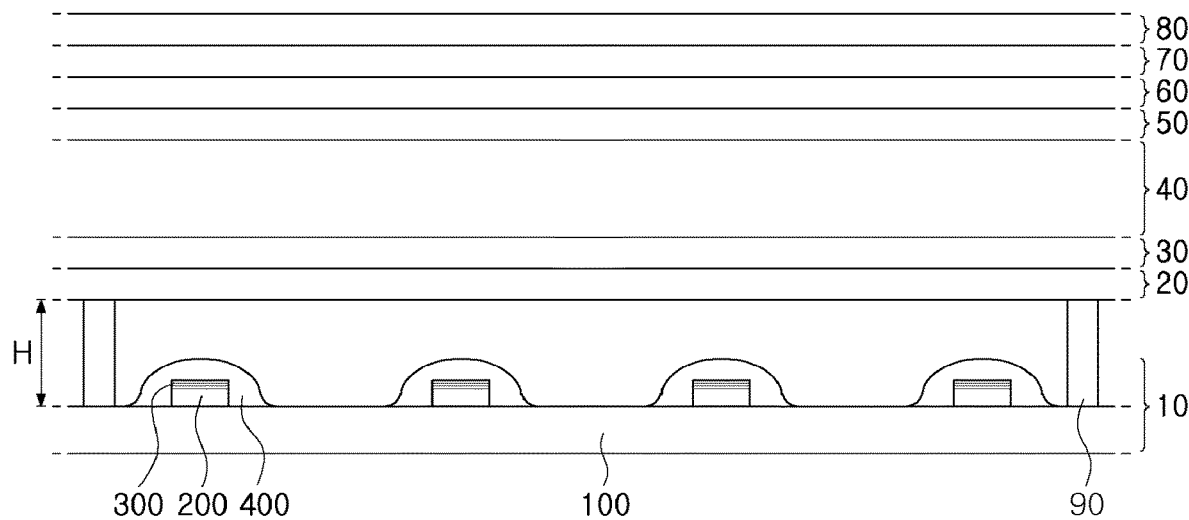
FIG. 13 is a cross-sectional view of a backlight unit according to an example embodiment.

Referring to FIG. 13, a display panel 1 including an optical module according to an example embodiment will be described. The display panel 1 may include the light source module 10 of FIG. 2 described previously, and therefore, a detailed description of the light source module 10 will be omitted. For example, the display panel 1 may be a liquid crystal display (LCD) device.

As illustrated in FIG. 13, the display panel 1 of an example embodiment may include the light source module 10, an optical sheet 20, first and second polarizing plates 30 and 70, a thin film transistor (TFT) substrate 40, a color filter substrate 60 on the TFT substrate 40, a liquid crystal layer 50 between the TFT substrate 40 and the color filter substrate 60, and a protective layer 80. The first and second polarizing plates 30 and 70 may be disposed on a lower portion of the TFT substrate 40 and an upper portion of the color filter substrate 60, respectively, and the optical sheet 20 and the light source module 10 may be disposed on the lower portion of the first polarizing plate 30.

The optical sheet 20 may be disposed on the upper portion of the light source module 10. The light source module 10 of an example embodiment may be a light source emitting blue light, and the optical sheet 20 may wavelength-convert the blue light emitted from the light source module to white light to emit the light upwardly. The optical sheet 20 may be a sheet in which a wavelength conversion material, e.g., a quantum dot (QD), is dispersed in a liquid binder resin. In an example embodiment, the QD may include a QD capable of wavelength-converting blue light into white light. The optical sheet 20 may be disposed to be spaced apart from the light source module 10 at a predetermined distance H by a support 90. In an example embodiment, the distance H may be about 30 mm or less. In an example embodiment, the distance H may be about 3.5 mm or less.

The liquid crystal layer 50 may display a desired image by changing a transmission pattern of light radiated from the light source module 10 according to, e.g., electrical stimulation applied to the liquid crystal.

The TFT substrate 40 may include, e.g., gate lines and a plurality of data lines formed in a plurality of matrix forms. A pixel electrode and a TFT may be formed at each of intersections of the plurality of gate lines and the plurality of data lines. A signal voltage applied through the TFT may be applied to the liquid crystal layer 50 by a pixel electrode, and the liquid crystal layer 50 may be arranged according to the signal voltage to determine light transmissivity.

For example, the color filter substrate 60 may be disposed in a form facing the TFT substrate 40 with the liquid crystal layer 50 therebetween. The color filter substrate 60 may include a color filter composed of RGB pixels through which light is transmitted and color is expressed, and a transparent electrode. The protective layer 80 may be disposed on an upper portion of the second polarizing plate 70 to protect structures disposed therebelow, e.g., the color filter substrate 60 and the liquid crystal layer 50, from external impacts.

Figure 14:
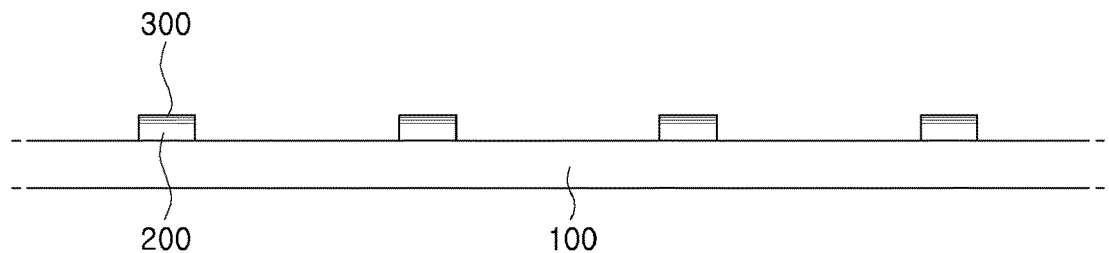
FIGS. 14 and 15 are schematic cross-sectional views of stages in a manufacturing process of a light source module according to an example embodiment.
Figure 15:
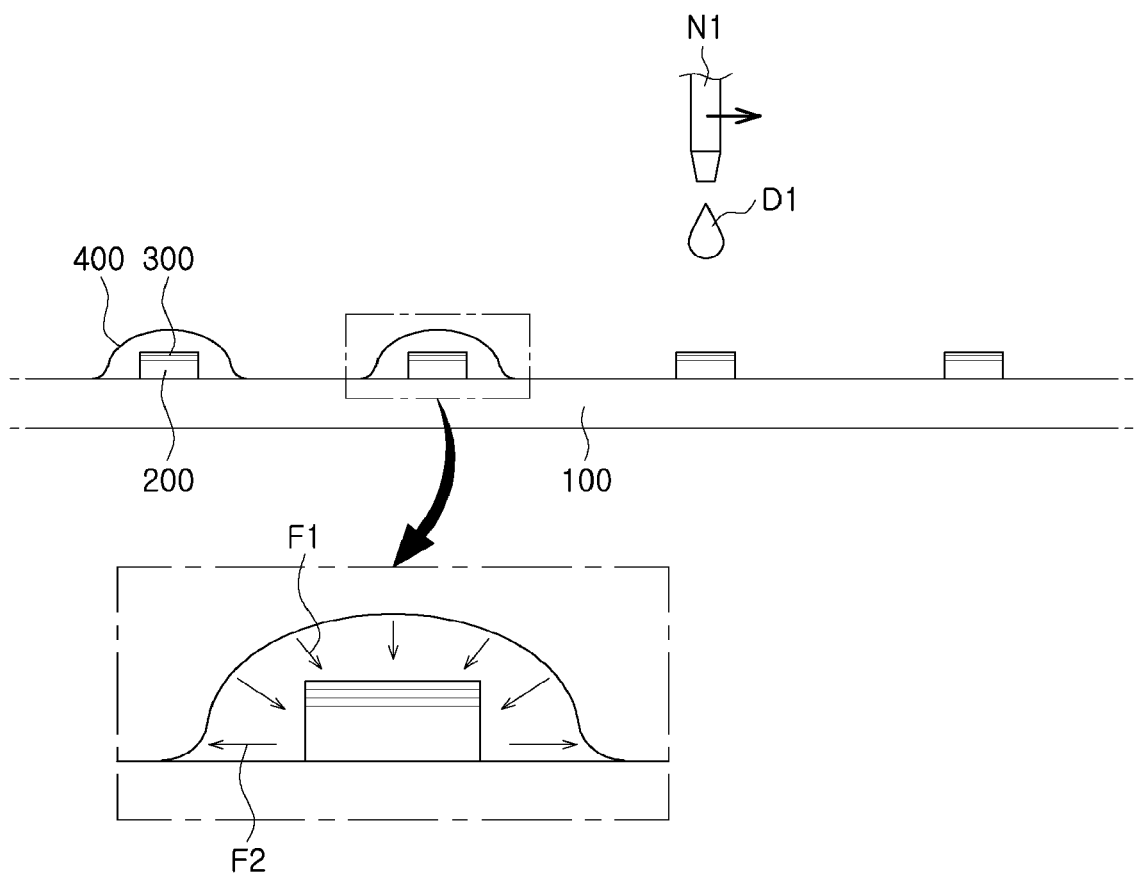

Next, a process of manufacturing the light source module 10 of FIG. 2 will be described with reference to FIGS. 14 to 15. FIGS. 14 and 15 are cross-sectional views showing stages in a manufacturing process of the light source module 10.

Referring to FIG. 14, the plurality of light emitting diode chips 200 may be mounted on the circuit board 100, e.g., the plurality of light emitting diode chips 200 may be spaced apart from each other. The multilayer reflective structure 300 may be formed on an upper surface of each of the plurality of light emitting diode chips 200, e.g., the multilayer reflective structures 300 may be formed on the light emitting diode chips 200 before the light emitting diode chips 200 are mounted on the circuit board 100.

Referring to FIG. 15, a lens 400 may be formed on each multilayer reflective structure 300 that covers a respective light emitting diode chip 200. The lens 400 may be formed by dotting a droplet D1 of a liquid silicone material on each of the plurality of light emitting diode chips 200 by sing a nozzle N1. However, formation of the lens 400 is not limited to the droplet process and may be formed by any suitable method, e.g., a dispensing process. In this case, the liquid silicone material may have a viscosity of about 30,000 cPs to about 100,000 cPs.

In the droplet D1 of the silicone material, a force F2 to spread and a force F1 to agglomerate act simultaneously to determine a surface shape of the lens 400. A central region of the lens 400, formed of the silicone material having a viscosity of about 30,000 cPs to about 100,000 cPs, has a greater force F1 to agglomerate than a force F2 to spread, resulting in a net force that forms a droplet shape with a high aspect ratio that has an upwardly convex shape. On the other hand, an outer region of the lens 400 has a greater force F2 to spread than a force F1 to agglomerate, resulting in a net force that spreads the silicone material on the surface of the circuit board 100 to form a shape having a low contact angle. Once the droplet D1 is applied and forms the shape of the lens 400, the lens is hardened, i.e., cured.

Figure 16:
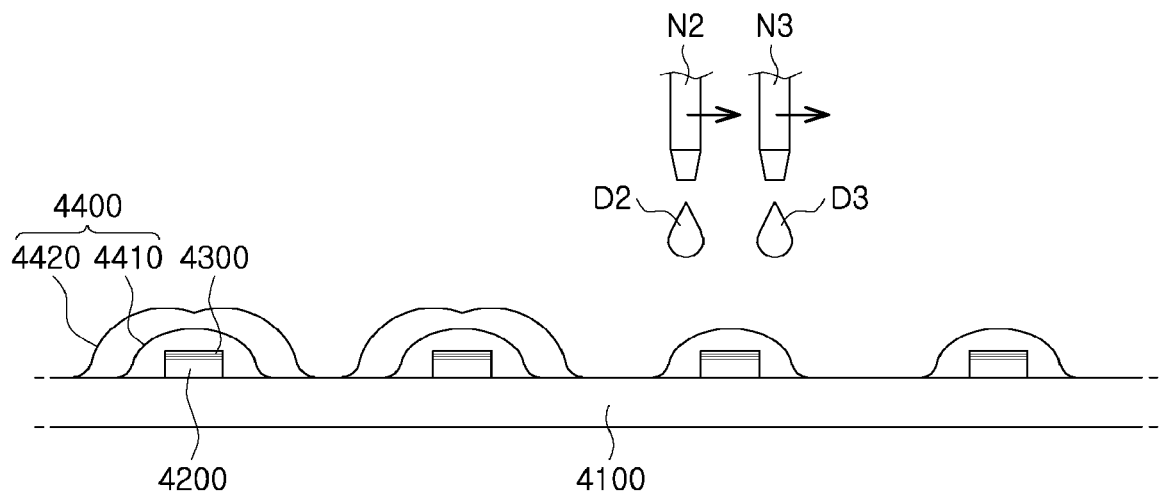
FIG. 16 is a schematic cross-sectional view of a manufacturing process of a light source module according to an example embodiment.

Next, a process of manufacturing the light source module of FIG. 10 will be described with reference to FIG. 16. FIG. 16 is a schematic cross-sectional view showing a manufacturing process of a light source module according to an example embodiment. FIG. 16 may be understood as a process after FIG. 15 described above.

Referring to FIG. 16, the second lens 4420 may be formed by dotting the droplets D2 and D3 having a liquid silicone material to cover the respective first lenses 4410 using nozzles N2 and N3. Although only two nozzles N2 and N3 are shown in FIG. 16, embodiments are limited thereto, e.g., four nozzles or eight nozzles may be disposed depending on the embodiment.

By way of summation and review, as the utilization range of semiconductor light emitting devices has widened, the utilization range thereof has been expanding to include light source fields in high current/high power fields. As semiconductor light emitting devices are required in the high current/high output field, research into improving the light emitting efficiency and the light distribution has been increased. In particular, in the field related to the light source module, a method for increasing an orientation angle of light emitted from a package in which a semiconductor light emitting device is mounted has been requested. Therefore, an aspect of embodiments provides a light source module having increased directivity of light and a display panel using the same.

That is, since a liquid resin having a specific viscosity (30,000 to 100,000 cPs) can be formed directly on the light emitting diode chip, a primary lens having a high aspect ratio can be formed with a central region having a convex surface and a peripheral region having a concave region, thereby having an acute contact angle. Without an additional secondary lens, since an orientation angle of light emitted from the light emitting diode chip can be increased, the thickness of the backlight can be reduced, e.g., a size of the light emitting diode chip employed in the backlight may be reduced to about 100 µm to reduce the thickness of the backlight.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light source module, comprising:
a circuit board;
a plurality of light emitting diode chips on an upper surface of the circuit board, the plurality of light emitting diode chips being spaced apart from each other by a distance of 7.5 mm or less, edges of each of the plurality of light emitting diode chips having a size of 500 µm or less, and each of the plurality of light emitting diode chips including:
a first surface facing the upper surface of the circuit board,
a second surface opposite the first surface, and
first and second electrodes on the upper surface of the circuit board and connected to the first surface;
a multilayer reflective structure respectively disposed on the second surface of each of the plurality of light emitting diode chips, the multilayer reflective structure covering the respective second surface, and the multilayer reflective structure including a plurality of alternately stacked insulating layers having different refractive indices; and
a first lens respectively covering each of the plurality of light emitting diode chips and contacting the circuit board, the first lens having an acute contact angle with the upper surface of the circuit board and having a height to width ratio of 0.2 to 0.4, the width being a diameter of a contact region between the upper surface of the circuit board and the first lens,
wherein an entirety of the first lens is formed integrally, the first lens including:
a first region in a center and protruding convexly relative to the upper surface of the circuit board, and
a second region at a periphery of the first region and being concave relative to the upper surface of the circuit board, the second region contacting the upper surface of the circuit board at the acute contact angle, and the first region and the second region being made from a same material.

2. The light source module as claimed in claim 1, wherein the first lens includes:
the first region in the center and having a first curved surface protruding convexly, the acute contact angle being smaller than an angle formed by a tangent line of the first curved surface with the upper surface of the circuit board; and
the second region at the periphery of the first region and having a second curved surface that is concave.

3. The light source module as claimed in claim 2, wherein a region in which the first curved surface and the second curved surface contact each other has an inflection point.

4. The light source module as claimed in claim 1, further comprising a second lens covering the first lens and being in contact with the upper surface of the circuit board.

5. The light source module as claimed in claim 4, wherein the first lens and the second lens are formed of a silicone material.

6. The light source module as claimed in claim 4, wherein the second lens has a shape that is rotationally symmetrical every 90 degrees with respect to a central axis of the first lens, when viewed in a top view.

7. The light source module as claimed in claim 4, wherein the first lens is formed of a silicone material having a first refractive index, and the second lens is formed of a silicone material having a second refractive index, the first refractive index being smaller than the second refractive index.

8. The light source module as claimed in claim 1, wherein the first lens has a thickness of 2.5 mm or less, as measured from an uppermost surface of the first lens to a bottommost surface of the first lens.

9. The light source module as claimed in claim 1, wherein each of the plurality of light emitting diode chips includes:
a growth substrate defining the second surface of each of the plurality of light emitting diode chips; and
a light emitting structure having a first conductivity-type semiconductor layer, an active layer, and a second conductivity-type semiconductor layer sequentially stacked on the growth substrate, respectively, the first and second electrodes being connected to the first and second conductivity-type semiconductor layers, respectively.

10. The light source module as claimed in claim 1, wherein:
the plurality of alternately stacked insulating layers in the multilayer reflective structure includes a first insulating layer having a first refractive index and a second insulating layer having a second refractive index, the first insulating layer and the second insulating layer are alternately stacked to define a distributed Bragg reflector, and the first insulating layer and the second insulating layer are repeatedly stacked 5 to 30 times.

11. A light source module, comprising:

a circuit board;

a plurality of light emitting diode chips on an upper surface of the circuit board, the plurality of light emitting diode chips emitting a blue light and being spaced apart from each other, and each of the plurality of light emitting diode chips having:
  a first surface facing the upper surface of the circuit board,
  a second surface opposite the first surface, and
  first and second electrodes on the first surface;

a first multilayer reflective structure respectively disposed on the second surface of each of the plurality of light emitting diode chips, the first multilayer reflective structure covering the respective second surface, and the first multilayer reflective structure including a plurality of alternately stacked insulating layers having different refractive indices; and a first lens respectively covering each of the plurality of light emitting diode chips and contacting the upper surface of the circuit board at an acute contact angle, the first lens having a thickness of 2.5 mm or less from the upper surface of the circuit board, and a contact region with the upper surface of the circuit board with a diameter of 1 mm to 3 mm, wherein the first lens includes:

a first region in a center and protruding convexly relative to the upper surface of the circuit board, and a second region at a periphery of the first region and being concave relative to the upper surface of the circuit board, the second region contacting the upper surface of the circuit board at the acute contact angle, and the first region and the second region being made from a same material.

12. The light source module as claimed in claim 11, further comprising a second multilayer reflective structure on the first surface of each of the plurality of light emitting diode chips, respectively, the second multilayer reflective structure including a plurality of alternately stacked insulating layers having different refractive indices.

13. The light source module as claimed in claim 11, wherein respective edges of each of the plurality of light emitting diode chips have a size of 500 μm or less, and the plurality of light emitting diode chips are spaced apart from each other by a distance of 7.5 mm or less.

14. The light source module as claimed in claim 11, wherein the first lens includes:

the first region in the center and having a dome shape; and
the second region extending at the periphery of the first region and gradually becoming thinner at its edge.

15. The light source module as claimed in claim 11, further comprising a second lens covering the first lens and being in contact with the upper surface of the circuit board.

16. The light source module as claimed in claim 11, wherein the first and second electrodes in each of the plurality of light emitting diode chips are both on the first surface.

17. A display panel, comprising:

a circuit board;

a plurality of light emitting diode chips on an upper surface of the circuit board, the plurality of light emitting diode chips emitting a blue light and being spaced apart from each other, and each of the plurality of light emitting diode chips having:
  a first surface facing the upper surface of the circuit board,
  a second surface opposite the first surface, and
  first and second electrodes on the first surface;

a multilayer reflective structure respectively disposed on the second surface of each of the plurality of light emitting diode chips, the multilayer reflective structure covering the respective second surface, and the multilayer reflective structure including a plurality of alternately stacked insulating layers having different refractive indices;

a first lens respectively covering each of the plurality of light emitting diode chips and contacting the upper surface of the circuit board at an acute contact angle, the first lens having a height to width ratio of 0.2 to 0.4, the width being a diameter of a contact region between the upper surface of the circuit board and the first lens; and an optical sheet in front of the plurality of light emitting diode chips and including a quantum dot converting the blue light into a white light, wherein the first lens includes:

a first region in a center and protruding convexly relative to the upper surface of the circuit board, and a second region at a periphery of the first region and being concave relative to the upper surface of the circuit board, the second region contacting the upper surface of the circuit board at the acute contact angle, and the first region and the second region being made from a same material.

18. The display panel as claimed in claim 17, wherein the plurality of light emitting diode chips are spaced apart from each other by a distance of 7.5 mm or less.

19. The display panel as claimed in claim 17, wherein a bottom surface of the optical sheet is at a distance of 3.5 mm or less from the upper surface of the circuit board.

20. The display panel as claimed in claim 17, further comprising a second lens overlapping at least one region of the first lens and each of the plurality of light emitting diode chips, the second lens being in contact with the upper surface of the circuit board.

* * * * *